United States Patent [19]

Hanamura et al.

[11] Patent Number: 5,091,325
[45] Date of Patent: Feb. 25, 1992

[54] PROCESS FOR MAKING MOS DEVICES FOR LOW-TEMPERATURE OPERATION

[75] Inventors: Shoji Hanamura, Kodaira; Masaaki Aoki, Minato; Toshiaki Masuhara, Nishitama, all of Japan

[73] Assignee: Hitachi, Ltd., Tokyo, Japan

[21] Appl. No.: 544,045

[22] Filed: Jun. 26, 1990

Related U.S. Application Data

[60] Division of Ser. No. 363,866, Jun. 9, 1989, abandoned, which is a continuation of Ser. No. 103,037, Sep. 30, 1987, abandoned, which is a division of Ser. No. 731,014, May 6, 1985, Pat. No. 4,710,648.

[30] Foreign Application Priority Data

| | | | |
|---|---|---|---|
| May 9, 1984 | [JP] | Japan | 59-90960 |
| Jul. 25, 1984 | [JP] | Japan | 59-152834 |
| Sep. 29, 1984 | [JP] | Japan | 59-205311 |

[51] Int. Cl.⁵ .................. H01L 21/336; H01L 21/203
[52] U.S. Cl. ........................ 437/40; 437/41; 437/57; 437/101; 437/937
[58] Field of Search ............ 357/23.12, 2, 23.4, 357/41, 42, 90; 437/40, 41, 57, 101, 937

[56] References Cited

U.S. PATENT DOCUMENTS

| | | | |
|---|---|---|---|
| 4,151,058 | 4/1979 | Kaplan et al. | 437/937 |
| 4,242,691 | 12/1980 | Kotani et al. | 357/23.3 |
| 4,315,781 | 2/1982 | Henderson | 357/23.12 |
| 4,385,947 | 5/1983 | Halfacre et al. | 437/57 |
| 4,498,224 | 2/1985 | Maeguchi | 437/41 |
| 4,514,747 | 4/1985 | Miyata et al. | 357/38 |
| 4,679,303 | 7/1987 | Chen | 357/23.11 |
| 4,700,212 | 10/1987 | Okazawa | 357/41 |

OTHER PUBLICATIONS

Chang, "Built-in Channel FET" IBM Technical Disclosure Bulletin, vol. 14, No. 4, Sep. 1971.

*Primary Examiner*—Brian E. Hearn
*Assistant Examiner*—T. N. Quach
*Attorney, Agent, or Firm*—Antonelli, Terry, Stout & Kraus

[57] ABSTRACT

Electric charge is supplied to a circuit node being in a charge storing state within a signal processor in response to a signal-processing commencing signal. The processor is operated in a low-temperature range, for example, in the range of temperature below 200K. By this structure, a leakage current is reduced, a high degree of integration equivalent to that of a dynamic circuit can be obtained, and the simplicity of a static circuit not requiring any complicated internal/external timing signals can be realized. Also disclosed is a semiconductor device, and method of forming such semiconductor device, for operation in a range of temperatures below 100° K. The device has, in a silicon surface region where the channel of the device is formed, a low impurity concentration layer (between the source and drain regions of the device). Such low impurity concentration layer is formed by evaporating amorphous silicon on a surface region of a semiconductor region of the device and passing the device through a low-temperature annealing process, the low impurity concentration layer having a lower total impurity concentration than that of the semiconductor region thereunder and having a thickness not more than 100 nm.

11 Claims, 15 Drawing Sheets

PROCESS FOR MAKING MOS DEVICES FOR LOW-TEMPERATURE OPERATION

This application is a divisional of application Ser. No. 363,866, filed June 9, 1989, now abandoned, which is a continuation of application Ser. No. 103,037, filed Sept. 30, 1987, now abandoned, which is a divisional of application Ser. No. 731,014, now U.S. Pat. No. 4,710,648.

BACKGROUND OF THE INVENTION

This invention relates to a semiconductor device and, particularly, to a semiconductor device of the insulated gate field effect transistor (hereinafter abbreviated to MOS transistor) type which permits a high degree of circuit integration and designing of a simplified circuit system by letting it operate at low temperatures.

Conventional dynamic type integrated circuits suffer from the drawback that it does not operate stably due to a variation of potential at a circuit node caused by a junction leak current. Therefore, the dynamic circuit needed a number of internal/external timing clocks for supplying the electric charge cyclically. On the other hand, static circuits not having the foregoing drawback of the dynamic circuit have another drawback that the degree of integration can not be made high because it requires elements for always supplying the charge to the circuit node.

For reference, FIG. 1 illustrates three-input NOR circuits formed, respectively, by a dynamic circuit (see FIG. 1(a)) using N-channel insulated gate type field effect transistors and by a static circuit (see FIG. 1(b)) using complementary type MOS transistors (hereinafter abbreviated to CMOS), and their exemplary operation waveforms. In this drawing, $X_1$, $X_2$, $X_3$ is an input signal, $Y_1$ is an output signal, $V_{cc}$ is a supplied voltage, $V_{ss}$ is a ground level, and $\phi$ is a timing clock. In the case of the dynamic circuit, the potential of the output node $Y_1$ becomes $V_{ss}$ owing to the driving MOS or junction leakage when the circuit is in the operating state represented by the exemplary waveform or if a waiting time t is long. Thus, the cyclic external timing clock $\phi$ is needed. Or, in the case of the static circuit, three MOS transistors are needed to supply the charge to the output node $Y_1$ only when all of the input signals have the potential $V_{ss}$. Thus, the degree of integration of the static circuit is low in comparison with the dynamic circuit.

The following articles describe the operation in the low-temperature range of MOS type semiconductor elements: (1) F. H. Gaensslen et al., "Very Small MOS FET's for Low-Temperature Operation" in *IEEE Trans. Electron Devices*, ED-24, 218-229, 1977; (2) W. Link et al., "Eigenschaften Von Mos-Ein-Transistor speicherzellen bei tiefen Temperaturen" in Band 33, 229-235, 1979; and (3) T. Moro-oka et al., "Operation Analysis of Dynamic RAM in Low-Temperature" in *Japan Electronic and Communication Society*, Preliminary Report for National Convention, 2-283, 1984.

Literature (1) analyzes how the characteristics of the device behave in the low-temperature range and reports, for example, how the relation between electron's speed and electric field changes in response to temperature variation, how the threshold voltage changes in response to temperature variation (the threshold voltage $V_T$ rises if the device is subjected to low temperatures), and at which temperature the electric charge accumulated in the junction point shows a smaller leakage, at 296K or 77K (of the low-temperature range); (the leak of electric charge is less in the low-temperature range). Literature (2) discloses the temperature characteristic of the dynamic type RAM and reports, for example, the relation between refresh time and temperature (the interval of refresh time is permitted to be long as it comes to the low-temperature range). However, neither Literature (1) nor Literature (2) recognized problems arising if the MOS element operable in the low-temperature range were applied to particular circuitryl Literature (3) is disclosing the operation characteristic of the dynamic type RAM at low temperatures and reports, for example, that the refresh time becomes long proportionally as it becomes a low temperature in the case of a paused refresh mode (where no other circuits are operating), whereas in a disturbed refresh mode (where other circuits are operating) the refresh time does not change if it is below a certain temperature within the low-temperature range. However, this literature does not comment on the most suitable circuit system for the MOS element operable in the low-temperature range.

SUMMARY OF THE INVENTION

It is the object of the present invention to provide, in order to answer a demand as noted above, a semiconductor device in the form of an integrated circuit which has a high degree of integration equivalent to that of the dynamic circuit and the simplicity of the static circuit not requiring complicated internal/external timing signals.

It is the specific object of the present invention to provide a circuit structure best suited to form the circuit by the MOS transistors of extremely small junction leak current.

One method of realizing an MOS transistor of extremely small junction leakage current is to cause the element to operate in the cryogenic range below 200K. FIG. 2 illustrates the feature of this one method, showing the intrinsic carrier concentration $n_i$ (the solid line: the calculated value) and the junction leakage current $I_L$ (the hollow point mark: the measured value). Because $I_L$ is substantially proportional to $n_i$, $I_L$ is though as to decrease ten or more orders of magnitude in the cryogenic range. Therefore, in the case of using such a method as noted above, because the potential of the circuit node does not show any appreciable variation, there is no need of always supplying the charge to the circuit node in the static circuit. Thus, a circuit system which can improve the degree of integration will become usable.

Accordingly, the present invention provides a circuit system improved on the degree of integration and power consumption which, by letting the circuit operate in the low-temperature range, eliminates a variation of potential which would result from the leak current of the circuit node and the need of always supplying the charge to the circuit node.

In brief, the semiconductor device of the present invention is a semiconductor integrated circuit formed by an insulated gate type field effect transistor having an extremely small junction leakage current ($10^{-12} A \cdot cm^{-2}$), and comprising a detection circuit for detecting a transient (variation) of an input signal into the integrated circuit, a clock generator for generating a signal-processing-mode commencing clock in response to a detection signal from the detection circuit, and a signal processing circuit including an insulated gate type field effect transistor for supplying the charge to a given circuit node in response to the clock.

Another feature of the semiconductor device of the present invention resides in that it includes a supply means for receiving the signal-processing commencing signal when the state of the input signal into the signal processing circuit changes to supply the charge to a given circuit node, and the supply means and the signal processing circuit are put in operation in the range of temperature below 200K.

DETAILED DESCRIPTION OF THE INVENTION

An embodiment of the present invention will be described with reference to FIG. 3. This illustrates the circuit arrangement of an integrated circuit according to the present invention, wherein there are provided, in connection with input signals $X_1, X_2, \ldots X_m$ and output signals $Y_1, Y_2, \ldots Y_n$, an input signal transient detector 1, a clock generator 2 for generating a certain signal-processing-mode commencing clock $\phi$ in response to the detection signal from the transient detector 1, and a signal processor 3 including a MOS transistor for supplying the electric charge to each circuit node in response to the clock. The transient detector 1 and clock generator 2 are connected together through plural data lines.

The detector detects one or more input signals given thereto when at least one of them changes and transmits the detection signal to the clock generator. In response thereto the clock generator generates the signal-processing commencing clock $\phi$ and transmits it simultaneously to each portion of the signal processor. On the other hand, the signal processor maintains its current state until the input comes to a change, and changes into a waiting state in response to a change of the input. Further, as the clock $\phi$ is applied, it passes into an activated static mode and begins the signal-processing operation. Then, if $\phi$ turns off, the circuit passes into an activated dynamic mode where it outputs the signals $Y_1-Y_n$ to complete a series of signal-processing, and passes into a storing mode.

These foregoing circuits formed by the MOS transistors of extremely small leakage current do not need a continuous supplying of the charge to each circuit mode, thus, they can employ a highly integrated circuit system similar to the dynamic circuit. Further, because the charge at each circuit node has been stored enough even if the waiting period is comparatively long where no change appears in the input signals, a timing clock having a peculiar period which is required in the conventional dynamic circuit is not required in the present invention. Therefore, according to the present embodiment, it is possible to design easily and within a short time an integrated circuit which is highly integrated and easy to use, thereby resulting in a considerable improvement of system performance and reduction of designing time.

Figure 3:
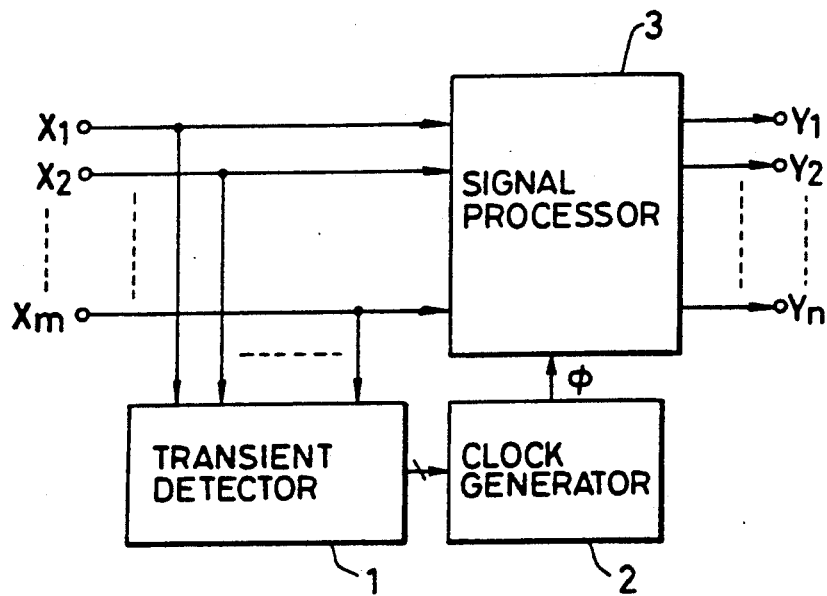
FIG. 3 is a circuit block diagram showing an embodiment of the present invention.
Figure 4:
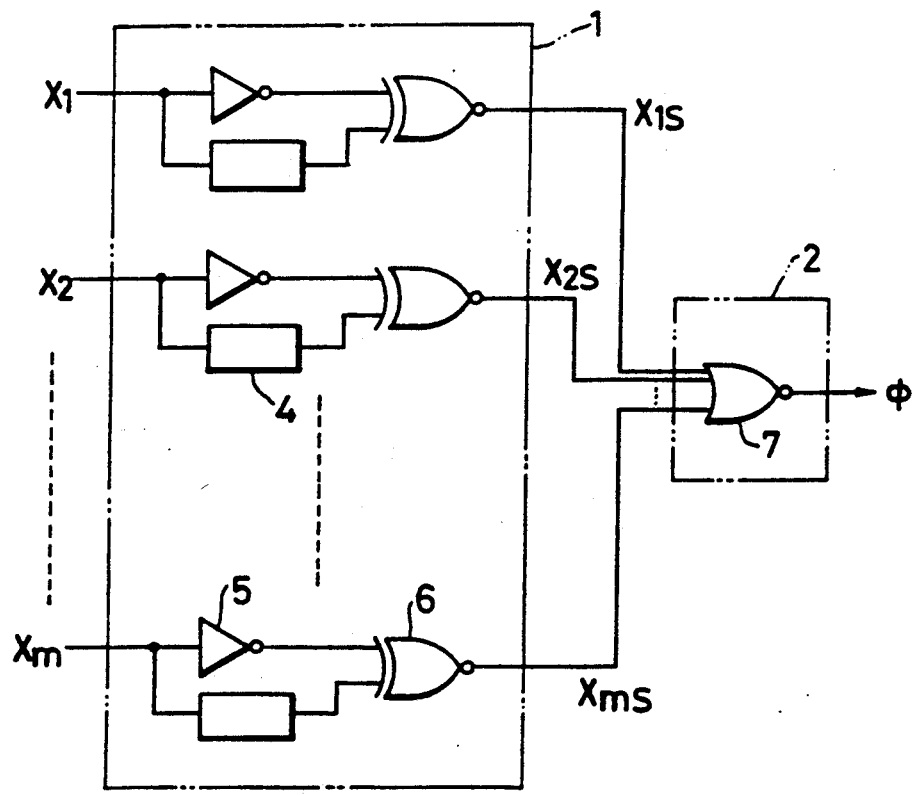
FIG. 4 is a logic circuit diagram of the first embodiment of the present invention.
Figure 5:
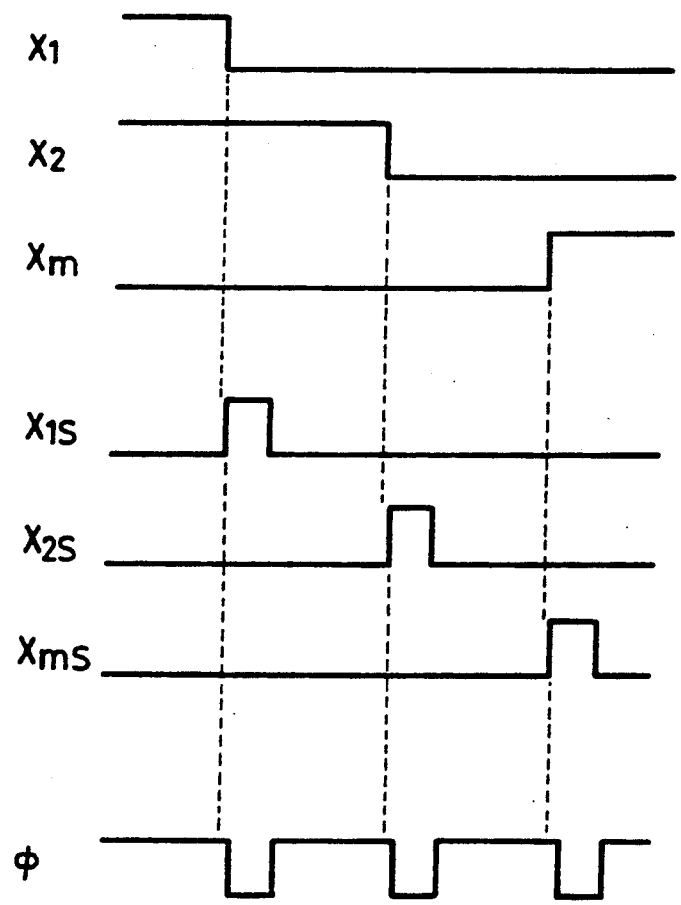
FIG. 5 is an exemplary waveform diagram of the first embodiment of the present invention.
Figure 5:
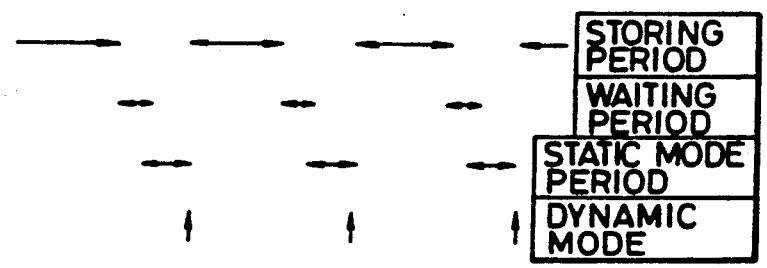

FIG. 4 illustrates in a logic circuit diagram an example of the detector 1 and clock generator 2 of the embodiment shown in FIG. 3. In FIG. 4, numeral 4 is a delay circuit, 5 is an inverter, 6 is an EXCLUSIVE NOR circuit, and 7 is a NOR circuit. Operation waveforms for the elements of FIG. 4 are illustrated in FIG. 5. In response to a change of input signals $X_1, X_2, \ldots X_m$, transient detection signals $X_{1s}, X_{2s}, \ldots X_{ms}$ are generated, by the use of which the clock $\phi$ is generated. Here, it should be noted that the clock $\phi$ exemplarily shown in the drawing is for the case where the MOS transistor for supplying the charge to each circuit node of the signal processor 3 is of the P-channel type. It will be apparent that the clock should be inverted properly if the MOS transistor is of the N-channel type.

Figure 6:
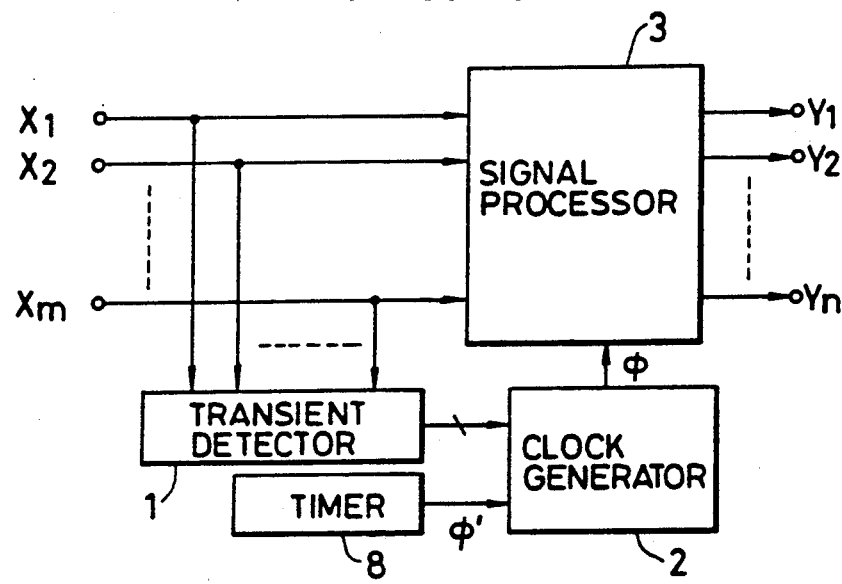
FIG. 6 is a circuit block diagram of the second embodiment of the present invention.

FIG. 6 illustrates the second embodiment of the present invention. The different point of this second embodiment from the first embodiment is that a timer 8 is provided in parallel to the input transient detector. This timer is included to prevent the circuit information from being destroyed by a leak when the input signal does not change for a long period, that is, on the basis of a long-period clock $\phi'$ generated by the timer a long-period operation-commencing clock is generated to refresh the circuit information.

Figure 7:
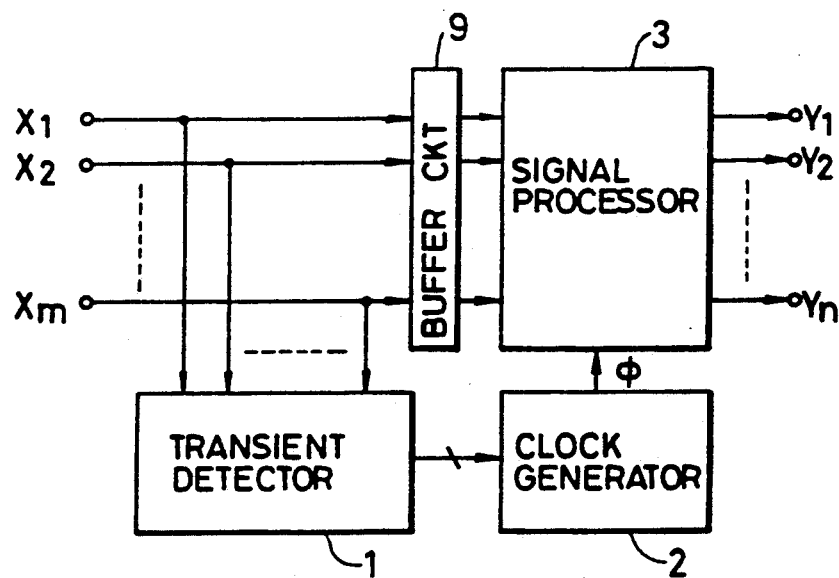
FIG. 7 is a circuit block diagram of the third embodiment of the present invention.

FIG. 7 illustrates another embodiment of the present invention. The different point of this embodiment from the first embodiment is that the input signals $X_1, X_2, \ldots X_m$ are applied through a buffer circuit 9 having a delay, phase-shift or latch function to the signal processor, instead of directly being applied thereto. According to this embodiment, the static mode period discussed in the first embodiment can be shortened. Thus, this embodiment is effective in reducing a consumption power and simplifying designing of the circuit.

FIG. 8 illustrates the semiconductor device which is a further embodiment of the present invention, in a block diagram and in an operation time chart.

$X_1 - X_m$ is the input signal, $Y_1 - Y_n$ is the output signal, $\phi$ is the signal-processing commencing signal (which is applied when the state of the input signal has changed), $V_{cc}$ is the supplied voltage, $V_{ss}$ is the ground level, $N_1 - N_i$ is the circuit node, 11 is the signal processor, 12 is a charger for supplying the charge to the node, and 13 is a logic circuit.

Figure 8A:
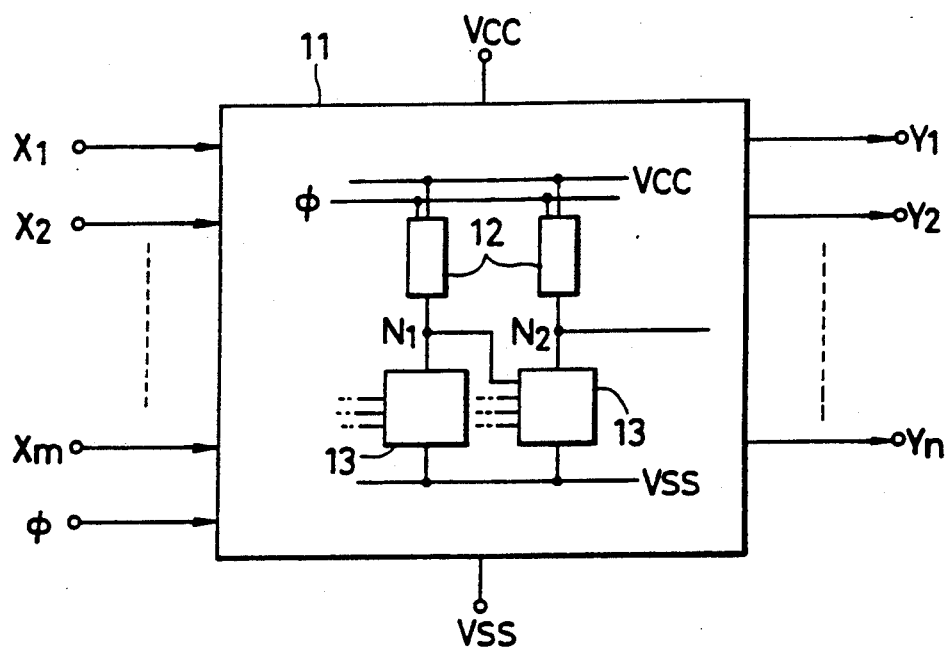
FIG. 8(a) is a block diagram of the semiconductor device which is a further embodiment of the present invention.
Figure 8B:
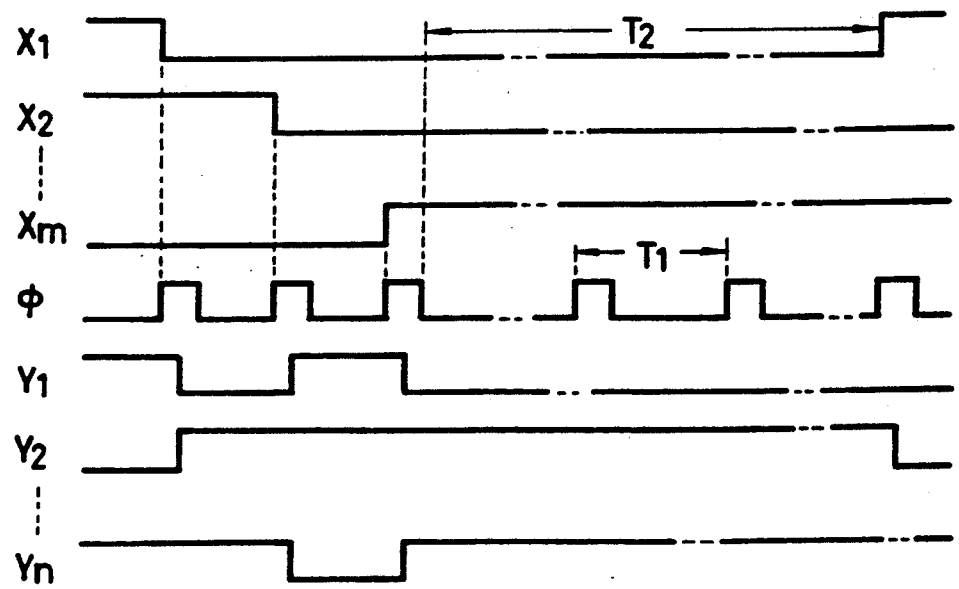
FIG. 8(b) is an operation time chart of the semiconductor device shown in FIG. 8(a)

In FIG. 8(b), $T_2$ represents the time during which the input signal does not change, and $T_1$ represents a constant period unrelated to the input signal.

In the embodiment shown in FIG. 8, the important structural condition is that the charger 12 for supplying the charge to the circuit node $N_1 - N_i$, being in the charge storing state, of the signal processor 11 in response to the signal-processing commencing signal $\phi$ ought to be provided, and the signal processor 11 ought to be operated in the low-temperature range below 200K. For reference, in this embodiment, the signal processor 11 is in the form of an integrated circuit, and the input signals $X_1 - X_m$ and signal-processing commencing signal $\phi$ are generated by an external circuit and supplied therefrom.

When the signal-processing commencing signal $\phi$ activates the charger 12 for a given time synchronous with a change in state of the input signal $X_1 - X_m$ (the static mode), or activates the charger 12 for a given time in accordance with a given period $T_1$, the charge is supplied from the power source $V_{cc}$ to a given circuit node $N_1 - N_i$. As a result, the circuit 11 changes into the operating state and the signal-processing operation is started in the logic circuit 13.

FIG. 8(b) illustrates, as an example, the case where the input signals $X_1 - X_m$ change their individual states as shown, wherein the signal-processing commencing signal $\phi$ is given in the form of an input signal which has a given pulse width and rises at the moment when the input signal changes. During the period $T_2$ where no change in state of the input signal $X_1 - X_m$ exists, the signal-processing commencing signal $\phi$ (for refreshing) generated at a given period $T_1$ irrespective of the input signal $X_1 - X_m$ is applied in order to compensate for a decreased part of the charge at the circuit node $N_1 - N_i$. As a series of signal processing is completed under this state, the output signal $Y_1 - Y_n$ corresponding to the input signal $X_1 - X_m$ is output and, then, as the signal $\phi$ turns off, the circuit node $N_1 - N_i$ passes into the charge storing state in correspondence to the state of the logic circuit 13. The foregoing description relates to the operation at ordinary temperature (300K, for example).

When the circuit of FIG. 8(a) is operated in the low-temperature range below 200K, the leakage current is reduced markedly, thus, the electric charge stored in the circuit node $N_1 - N_i$ decreases by only a negligible amount. Accordingly, even when the time $T_2$ during which the input signal $X_1 - X_m$ does not change is sufficiently long in comparison to the signal-processing time, the circuit 11 operates stably and no current exists flowing through the circuit 11 during the period $T_2$. Thus, it is possible to reduce power consumption. Further, because of the relation between the operation temperature (the low-temperature range) and the frequency of operation, no refresh operation is required even if $T_1 = \infty$, i.e., there is no change in state of the input signal for a long time.

Figure 9:
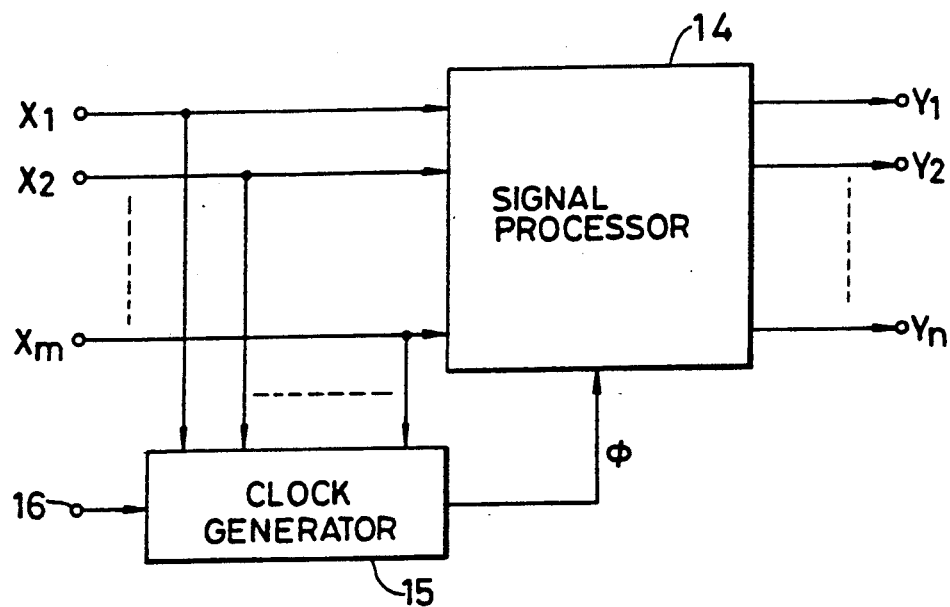
FIGS. 9 and 10 are block diagrams of other embodiments of the present invention.
Figure 10:
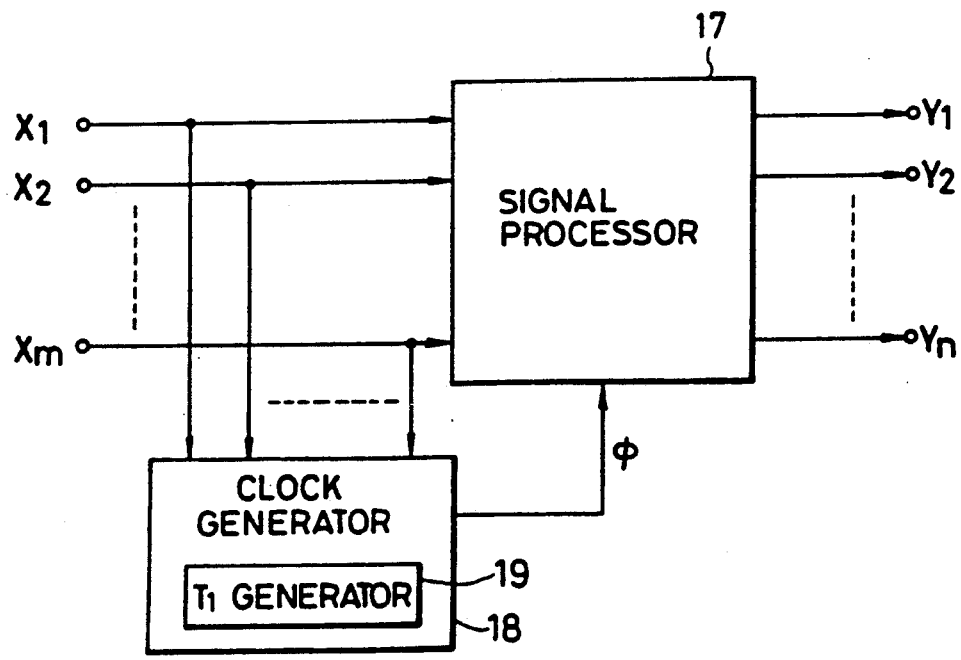

FIGS. 9 and 10 are the block diagrams of semiconductor devices which are other embodiments of the present invention.

The embodiments of FIGS. 9 and 10 are devices partially modified on the basis of the embodiment shown in FIG. 8. While in FIG. 8 the generator of the signal-processing commencing signal $\phi$ is provided externally in the form of an external circuit, in FIGS. 9 and 10 signal generators 15, 18 for detecting a change in state of the input signal $X_1 - X_m$ into the signal processor and generating the signal-processing commencing signal $\phi$ are provided on the same semiconductor substrate on which the signal processors 14, 17 are also formed.

In FIG. 9, 14 is the signal processor, 15 is the circuit for detecting a change in state of the input signal $X_1 - X_m$ and generating the signal-processing commencing signal $\phi$, and 16 is an input signal terminal to activate the $\phi$ generator 15 at a given period $T_1$. According to this embodiment, because external signal manipulation, for example, monitoring the input signal, becomes unnecessary, simplicity in using the device is markedly enhanced.

In FIG. 10, 17 is the signal processor, 18 is the circuit for generating the signal-processing commencing signal $\phi$, and 19 is the circuit for generating the timing signal of a given period $T_1$. The $\phi$ generator 18 generates the signal-processing commencing signal $\phi$ synchronous with a change in state of the input signal $X_1 - X_m$ or with a timing output having the period $T_1$ of the internal signal generator 19.

Because the device shown in FIG. 10 includes on the same substrate as that of the signal processor 17 the $\phi$ signal generator 18 which includes the circuit 19 for generating a given cyclic signal, compared with the device shown in FIG. 9, the device shown in FIG. 10 does not need an external synchronizing-signal generator and has a reduced number of input terminals. Thus, simplicity in using is further improved.

Figure 11:
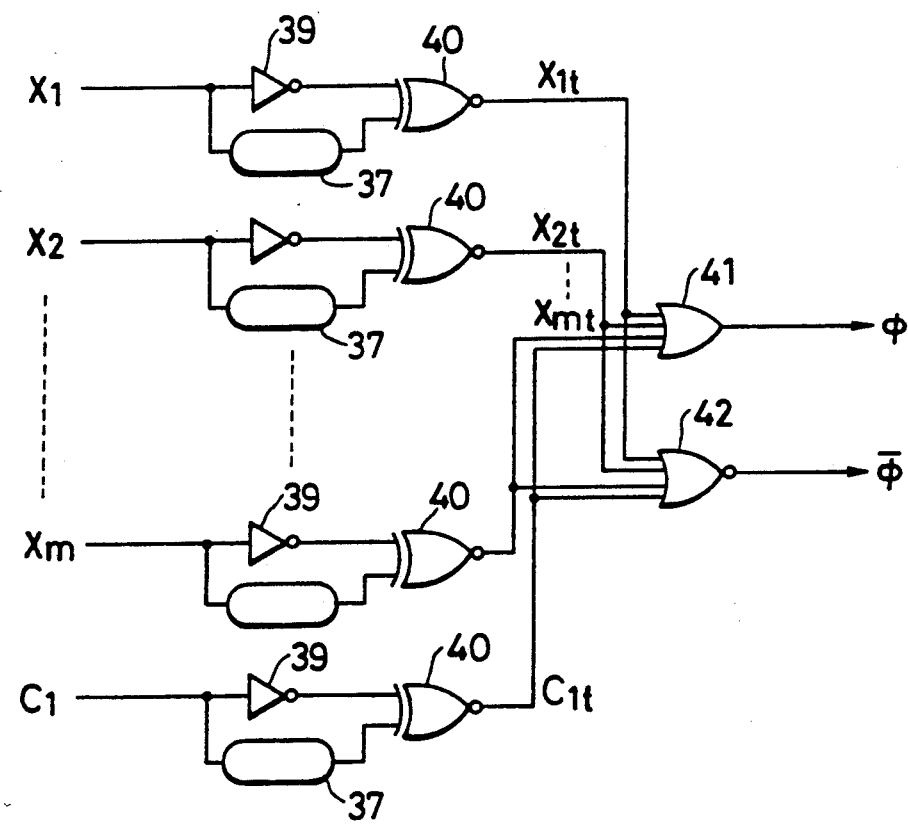
FIGS. 11 and 12 are logic circuit diagrams of timing signal generators of the signal-processing commencing signal generators shown in FIGS. 9 and 10, respectively.
Figure 12:
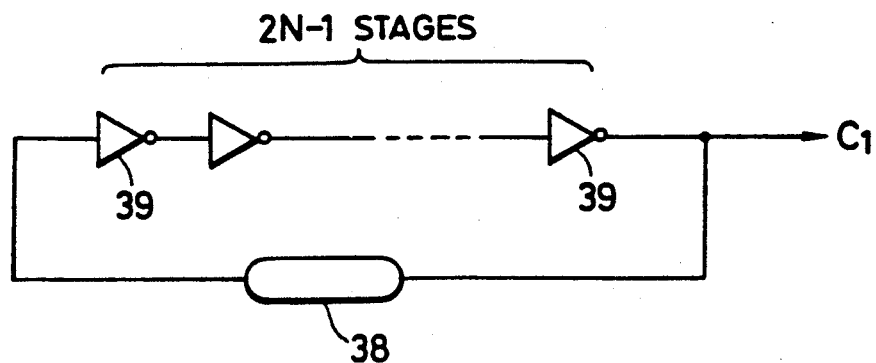
Figure 13:
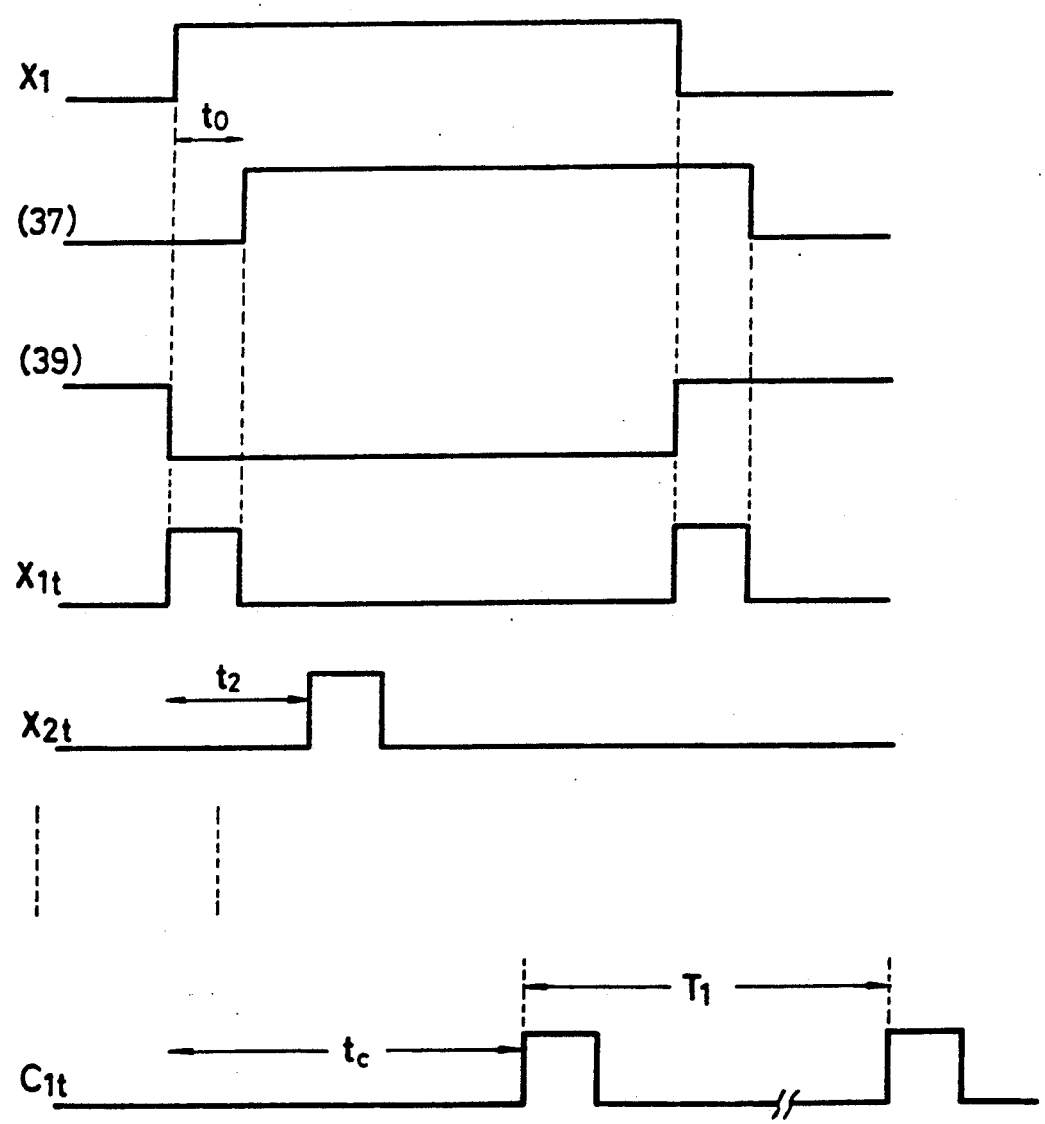
FIG. 13 is an operation time chart of the device shown in FIG. 9.

FIGS. 11 and 12 are the concrete logic circuit diagrams of the signal-processing commencing signal generator and the given-period timing signal generator shown in FIGS. 9 and 10, respectively, and FIG. 13 is the operation time chart for the generator shown in FIG. 11.

In FIG. 11, $X_1 - X_m$ is the input signal, $C_1$ is the timing signal having a given period $T_1$, 37 is a delay circuit (a delay time $t_o$), 39 is an inverter, 40 is an EXCLUSIVE NOR circuit, 41 is an OR circuit, and 42 is a NOR circuit.

In response to a variation of the input signal $X_1 - X_m$ and the timing signal $C_1$ having a given period $T_1$, signals $\phi$ and $\overline{\phi}$ (inverted signal of $\phi$) having a pulse width of time $t_o$ set by the delay circuit 37 are generated. For example, as the input signal $X_1$ having the waveform shown by $X_1$ in FIG. 13 is generated, it is delayed by $t_o$ by the delay circuit 37 as shown in waveform (37) of FIG. 13. On the other hand, the input signal $X_1$ is inverted by the inverter 39 as shown in waveform (39) of FIG. 13, applied to the EXCLUSIVE NOR circuit 40 together with waveform (37), and changed into a signal having a pulse width $t_o$ as shown in $X_{1t}$ of FIG. 13. By applying this resultant signal to the OR circuit 41 and the NOR circuit 42, the signal-processing commencing signals $\phi$ and $\overline{\phi}$ are output.

Similarly, if each input signal $X_2, X_3, \ldots X_m$ is given with each lagging time $t_2, t_3, \ldots t_m$ relative to $X_1$, pulses as shown in $X_{2t}$ and so forth of FIG. 13 are generated at timing positions each lagging by $t_2, t_3, \ldots t_m$ from pulse $X_{1t}$, by means of the corresponding delay circuit 37, inverter 39 and logic circuit 40. Further, the timing signal $C_1$ having a given period $T_1$ is also processed in the same way as above, and a pulse signal having an interval $T_1$ between successive pulses is generated at the timing position lagging by $t_c$ from the input signal $X_1$.

FIG. 12 illustrates a concrete example of the timing signal ($C_1$) generator 19, which is included in the signal-processing commencing signal ($\phi$) generator 19.

This generator 19 is a ring oscillator formed by the inverter 39 of odd stages (2N−1) and the delay circuit 38 creating a delay having a negative dependence on temperature. By setting a delay time $t_d$ of the delay circuit 38 as to have a relation $t_d \propto 1/I_L$ in comparison to the foregoing junction leakage current $I_L$, a long-period timing signal is obtained in case $I_L$ is small, i.e., the charge storing period is long, otherwise, a short-period timing signal is obtained.

Figure 14:
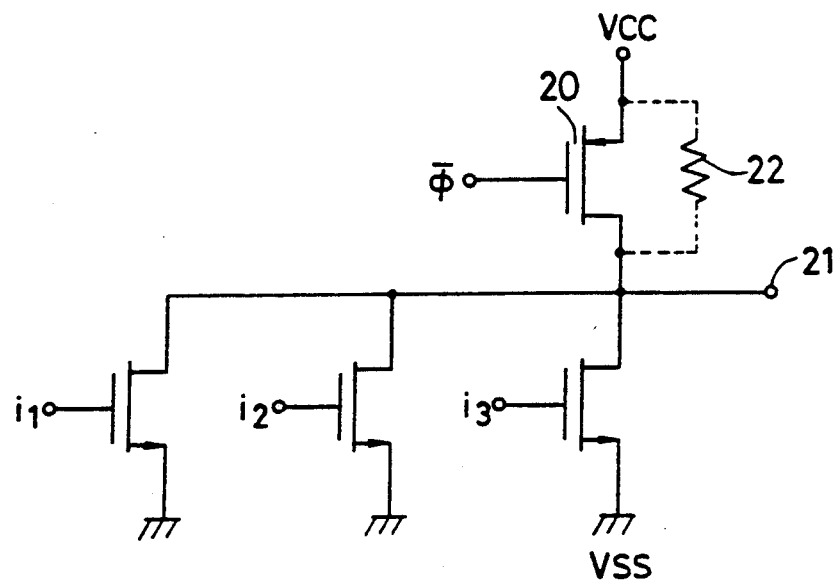
FIG. 14 is a diagram showing a concrete example of the signal processor of FIGS. 8, 9 and 10.
Figure 15:
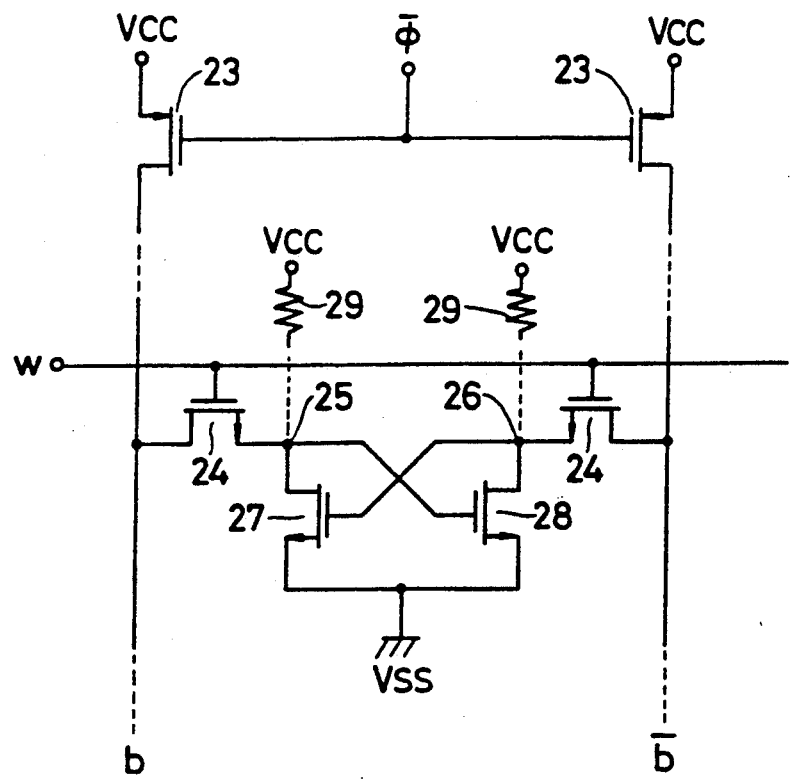
FIGS. 15 and 16 are diagrams each showing the arrangement of one-bit portion of a RAM which is another concrete example of the signal processor.
Figure 16:
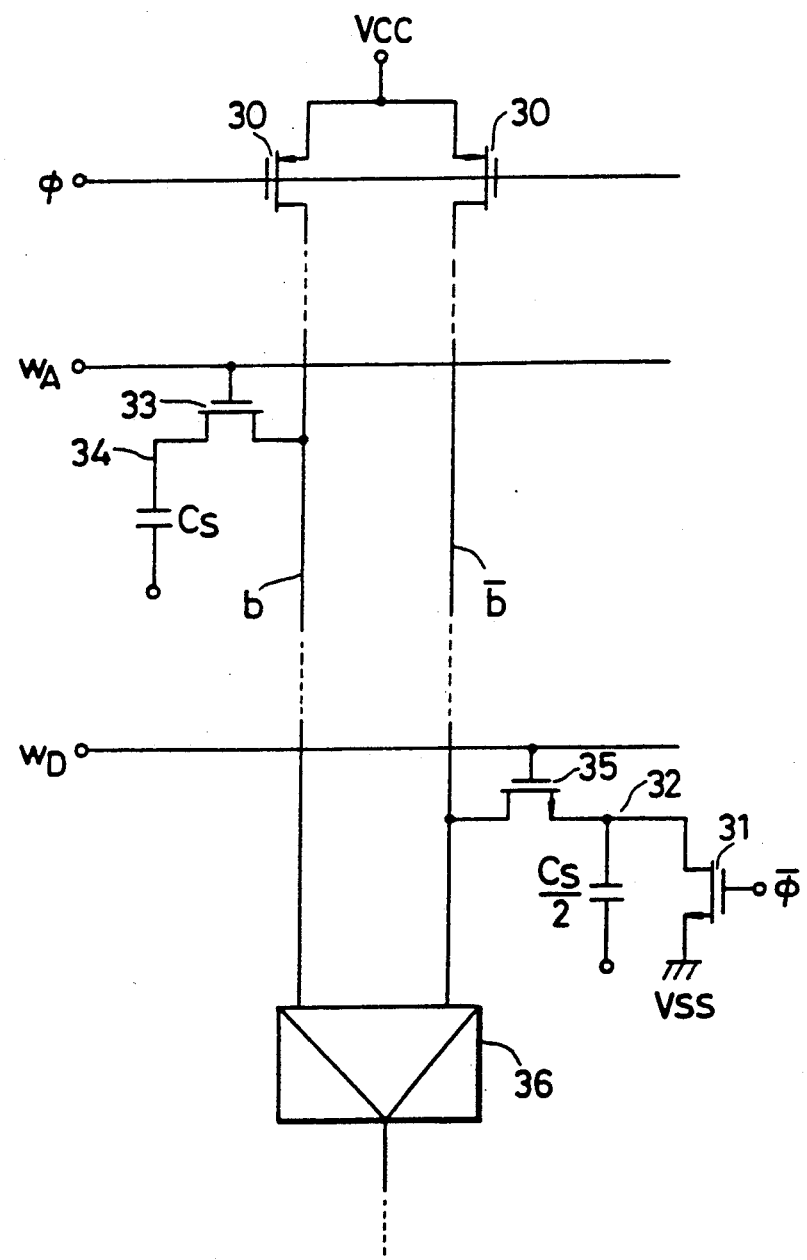

FIGS. 14, 15 and 16 illustrate the concrete examples of the signal processors shown in FIGS. 8, 9 and 10, respectively.

FIG. 14 illustrates a three-input NOR circuit portion. As the signal-processing commencing signal $\overline{\phi}$ activates a charge supplier 20, the charge is supplied from the power source $V_{cc}$ to the circuit node 21, thus, the circuit performs a static operation corresponding to the input $i_1 - i_3$. When $\overline{\phi}$ deactivates the charge supplier 20 after a given time, the charge is accumulated at the node 21 only when none of $i_1-i_3$ has been activating the logic circuit, and the thus accumulated charge is stored there until the next $\overline{\phi}$ activates the supplier 20.

According to the feature of FIG. 14, a low power consumption circuit can be realized with simplicity similar to that of the conventional static circuit. For reference, an element 22 connected parallelly across the supplier 20 in FIG. 14 (as shown by a broken line) is a large resistance element of more than one GΩ, which will be connected when the device is used at ordinary temperature. That is, though in the low-temperature range the leakage current flows little and this resistor 22 is unnecessary, the leakage current is large at ordinary temperature and the charge at the node 21 leaks out. Therefore, by means of this large resistor 22, a leaked part of the charge is supplemented from the power source $V_{cc}$. By this means it is possible to compensate for the charge storing characteristic over a temperature range higher than ordinary temperature thereby to enhance the operation stability of the circuit.

For reference, in FIG. 14, a P-MOS transistor is used for the charge supplier 20 and n-MOS transistors are used for the transistors being controlled by the input $i_1 - i_3$.

FIG. 15 illustrates the structure of a one-bit portion of the random access memory (RAM) as another example of the signal processor.

As the signal-processing commencing signal $\overline{\phi}$ activates the charge supplier 23, the charge is supplied from the power source $V_{cc}$ to bit lines b, $\overline{b}$ and, further, as the signal on a word line w activates the n-MOS transistor 24 the charge is supplied to the circuit nodes 25, 26 being in an information storing state. In this moment, because cross-connected elements (n-MOS transistors) 27, 28 mutually activate one and deactivate the other in correspondence to the values of charge at the nodes 25, 26, the corresponding signals are output onto the bit lines, whereby their readout is started.

At the time of performing the write operation, the charge corresponding to write information is applied to the bit lines b, $\overline{b}$ to supply forcedly the same to each node through the transistors 24. After a given time, the word line w and signal-processing commencing signal $\overline{\phi}$ deactivate respective transistors 23, 24. Thus, the charge at the node 25 or 26 is put in the stored state and maintained there until the next $\overline{\phi}$, w activate the transistors 23, 24. In case the circuit is operated in the low-temperature range, there appears no leakage of the charge even if $\overline{\phi}$, w do not activate the transistors 23, 24 for a long time, thus, the circuit can operate stably. In the example of FIG. 15, the degree of integration can be increased to about one and a half times in comparison to the conventional static circuit. For reference, an element 29 shown by a broken line in FIG. 15 is a large resistance element of more than one GΩ and by inserting the same in the circuit as shown, similarly to the case of the the element 22 shown in FIG. 14, it is possible to compensate for the charge storing characteristic over the temperature range higher than ordinary temperature thereby to enhance the operation stability of the circuit.

FIG. 16 illustrates, as another example of the signal processor, the structure of a one-bit portion of the RAM provided with a dummy cell.

Because the signal of charge stored in a capacitor $C_s$ of a memory cell is small, the dummy cell having a capacitor $C_s/2$ is added for the comparison operation in a differential amplifier 36, whereby the amplifier amplifies a difference signal to achieve readout of information.

Specifically, the signal-processing commencing signals $\phi$, $\overline{\phi}$ deactivate the charge supplier 30 to terminate supplying of the charge from the power source $V_{cc}$ to the bit lines b, $\overline{b}$ having been taking place up to this moment, and deactivate an element 31 having been in the activated state to maintain the potential of a circuit node 32 of the dummy cell at $V_{ss}$. Then, as elements 33, 35 are activated by the signals applied to the word lines $w_A$, $w_D$, signals corresponding to the charges at nodes 34, 32 appear on the bit lines b, $\overline{b}$. Thus, by amplifying differentially these signals which appear on the bit lines by means of the differential amplifier 36, readout of information is commenced. In case of performing the write operation, it is enough to externally supply the charge corresponding to information forcedly to the circuit through the amplifier 36 in this moment. If so done, after a given time the elements 33, 35 are deactivated by the signals on $w_A$, $w_D$, and, as the signals $\phi$, $\overline{\phi}$ activate the elements 30, 31, the node 34 changes into the charge storing state. Thus, stored charge is maintained there until the next signal on $w_A$ activates the element 33.

At low temperature below 200 K., because the charge storing period is sufficiently long, a special refresh operation is unnecessary. Correspondingly, a special signal therefor is also unnecessary, and thus, the circuit designed in accordance with this embodiment can be simplified as is the case of the static circuit, even in the form of the dynamic circuit.

Figure 17:
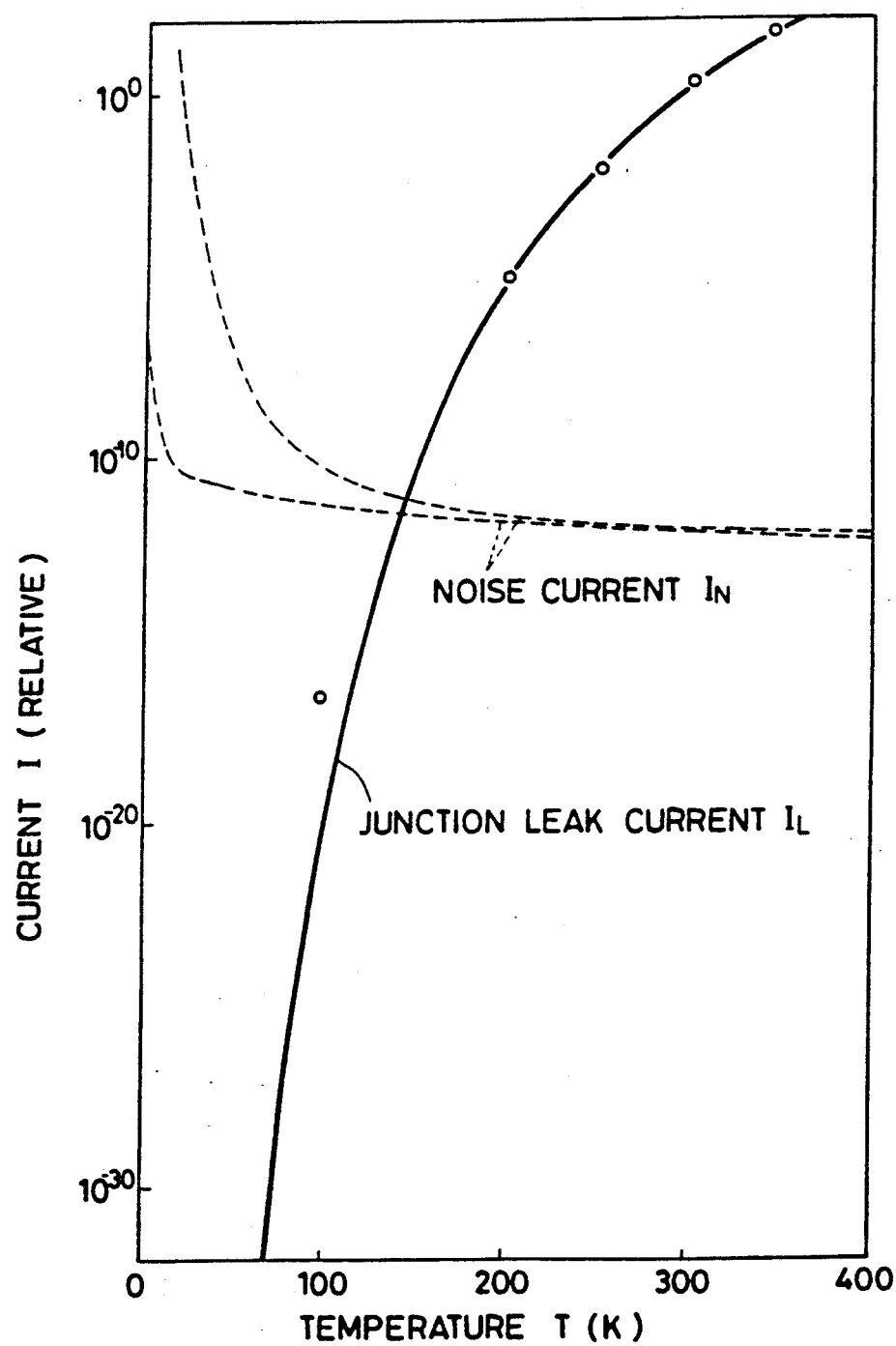
FIGS. 17, 18 and 19 are a characteristic diagram and sectional views of semiconductor devices which are other embodiments of the present invention.
Figure 18:
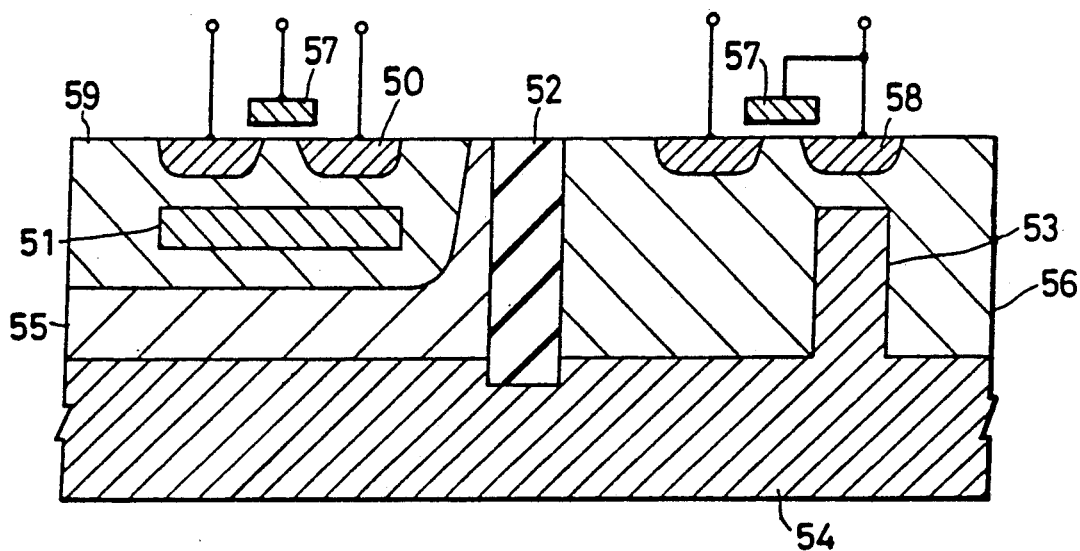

FIGS. 17 and 18 are, respectively, the characteristic diagram and sectional view of a semiconductor device which is another embodiment of the present invention.

Figure 1A:
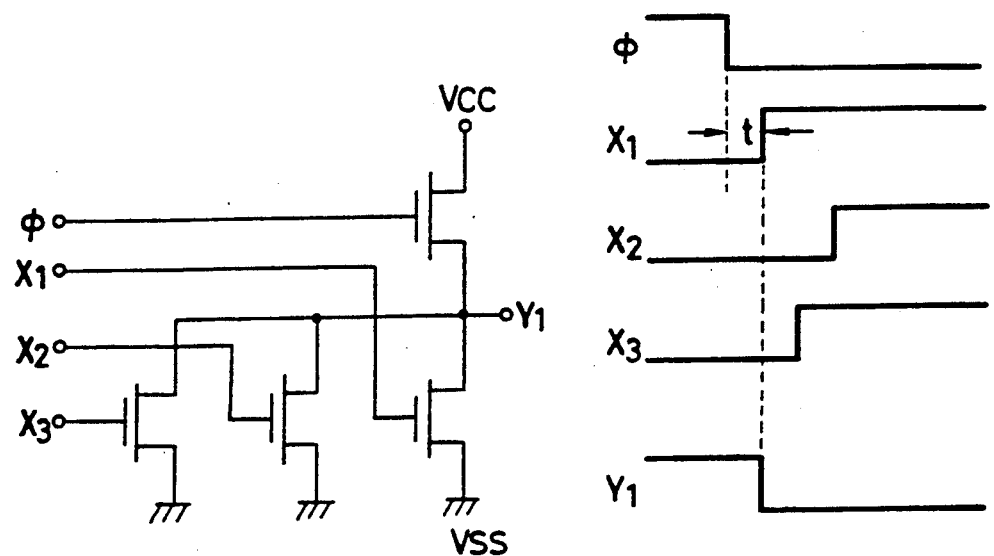
FIG. 1(a) is a diagram showing a dynamic circuit and its waveform.
Figure 1B:
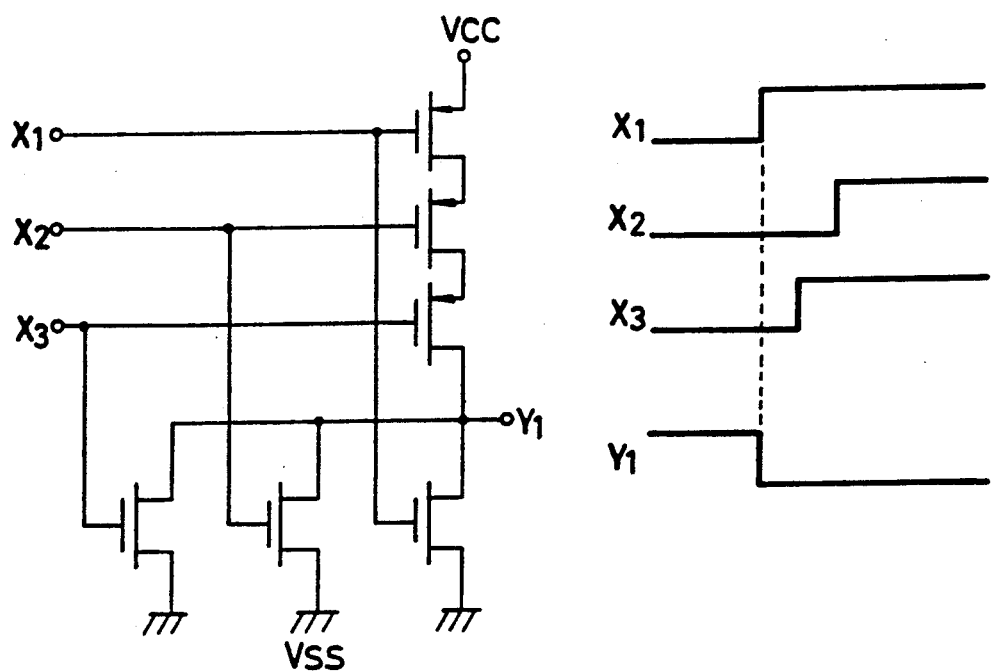
FIG. 1(b) is a diagram showing a static circuit and its waveform.
Figure 2:
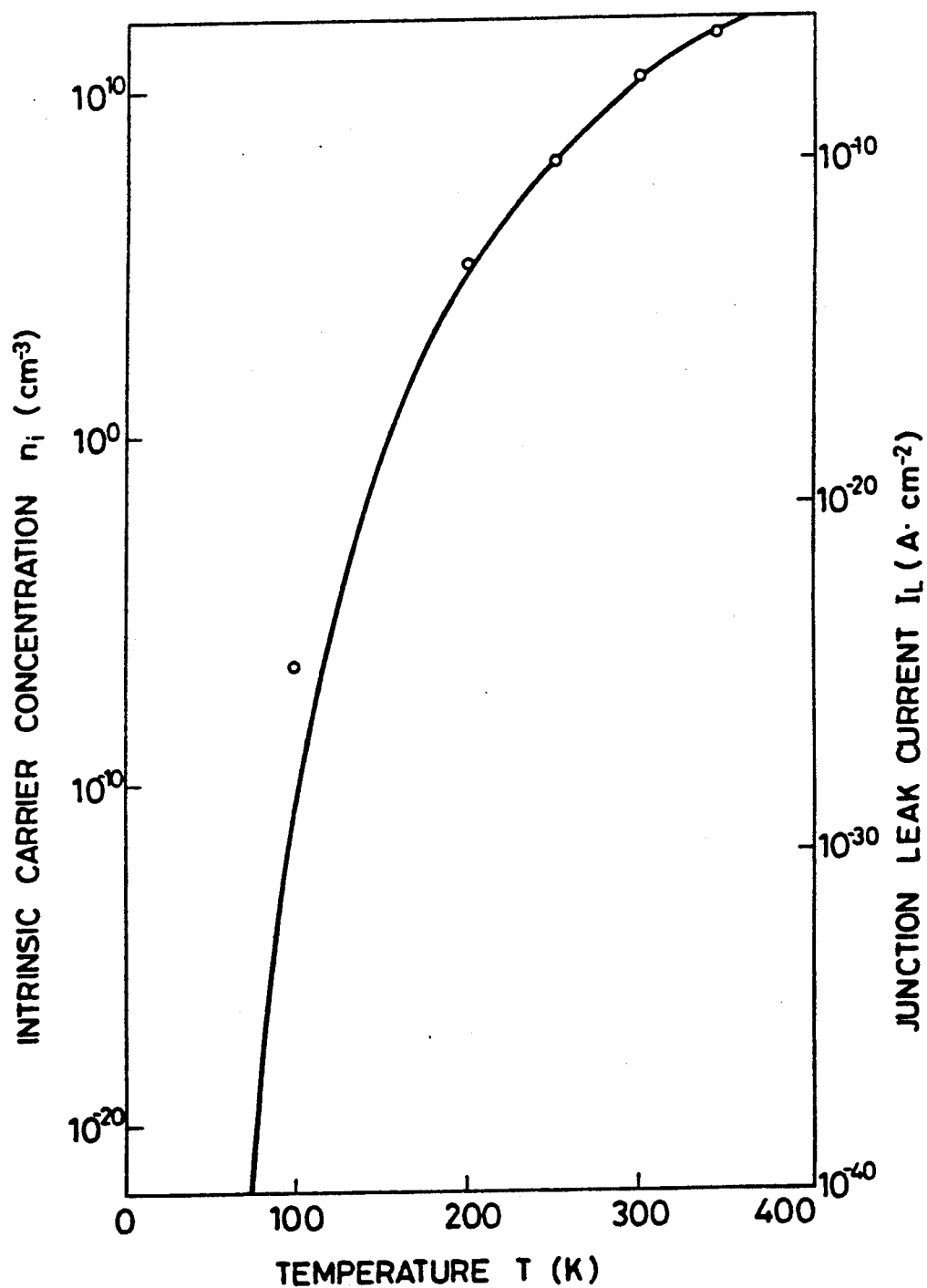
FIG. 2 is a leak current characteristic in the cryogenic range.

Specifically, FIG. 17 illustrates the relation between junction leakage current $I_L$ shown in FIG. 2 and noise current $I_N$ of the MOS transistor operating in the saturation mode. In the MOS transistor being in the saturation mode, as the electric field concentrates about the vicinity of the drain, a collision of electrons occurs, and pairs each comprised of an electron and a hole are generated by ionization. As a minority carrier (the noise current $I_N$) caused by ionization is injected into the semiconductor substrate, it destroys the information of other stored charge.

Since the noise current $I_N$ depends strongly on the extent of the electric field in the vicinity of the drain, it is hardly possible to correlate it to the leakage current $I_L$, but, it is thought that the noise current exhibits an exponential-functional dependence, $I_N \propto \exp(\phi_B/kT)$, with respect to an absolute temperature, and the relation, $I_L << I_N$, appears in the low-temperature range.

Under such circumstances as above, the noise current $I_N$ discharges the charge at the circuit node being in the charge storing state as described above, thereby causing the circuit to malfunction. FIG. 18 illustrates an embodiment for preventing this noise current $I_N$ from appearing to enhance the effect of the present invention.

In FIG. 18, 54 is a high impurity concentration semiconductor substrate of a first type of conductivity, 55 is a low impurity concentration layer of the same type of conductivity as that of 54, 56 is a low impurity concentration layer of the opposite conductivity type to that of 54, 57 is a gate electrode, 58 is the drain region of the MOS transistor of the opposite conductivity type to that of 56 being in the saturation mode state, 59 is a well region of the opposite conductivity type to that of 55 having such a concentration gradient that the impurity concentration becomes high approaching the surface, 50 is the drain or source region of the MOS transistor of the opposite conductivity type to that of 59, forming the circuit node being in the charge storing state, 51 is a high impurity concentration buried layer, formed inside the region 59 and provided as to face the region 50, of the same conductivity type as that of the region 59, 52 is an insulator region for isolating the MOS transistor being in the saturation mode state from the circuit node being in the charge storing state, and 53 is a projection region of a region 54, provided inside the layer 56 as to face the region 58. Each of these regions is applied with a bias as so not to become a forward biased state.

By the use of the structure shown in FIG. 18, the noise current owing to the minority carrier generated in the vicinity of the region 58 (i) is absorbed into the substrate 54 by the projection region 53, (ii) is insulated by the insulator region 52 with the carrier blocked, (iii) the carrier can hardly reach the circuit node 50 due to a barrier (layer) given by a junction between the well region 59 and low impurity concentration layer 55 or a barrier given by the impurity concentration gradient of the well region 59, and (iv) by a barrier created by the difference in impurity concentration between the buried layer 51 and well region 59 the carrier can hardly reach the circuit node 50.

Figure 19:
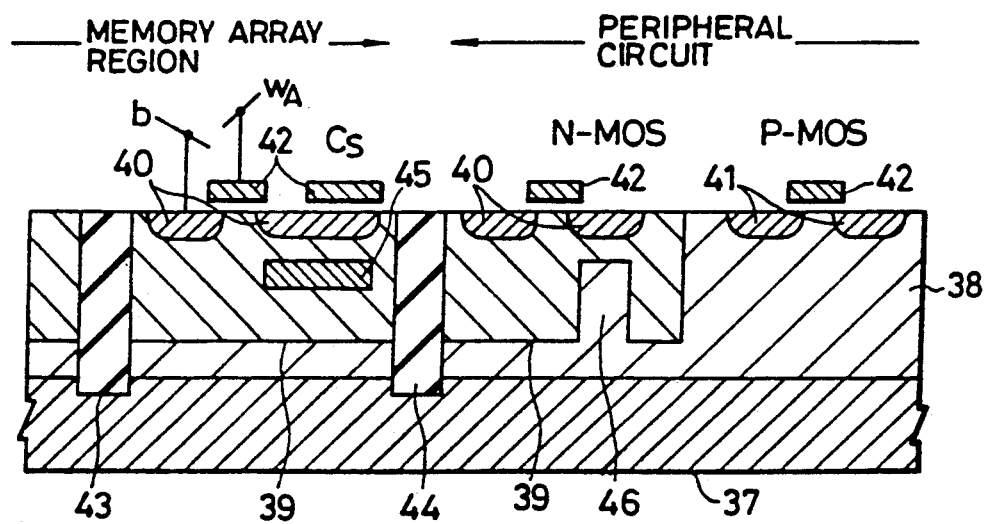

FIG. 19 illustrates an embodiment which is formed by applying the structure of FIG. 18 to the memory circuit of FIG. 16. Specifically, FIG. 19 illustrates a memory cell within a memory array region composed of a gate connected to the word line $w_A$, a drain connected to the bit line b, a source connected to the storage capacitor $C_S$, and this storage capacitor $C_S$, and N-channel MOS and P-channel MOS within a peripheral circuit region being in the saturation mode. 37 is an n+- or n-type substrate, 38 is an n-type region, 39 is a P-type well region, 40 are n+-type drain, source regions, 41 are P+-type drain, source regions, 42 is a gate, 43, 44 is an isolation region of insulator, 45 is a P+-type buried layer, and 46 is an n-type projection region. In this embodiment, flowing of the noise charge into a charge storage capacitor section is prevented by providing the N-channel MOS acting as a source of generating the noise charge within the well having the concentration gradient, by providing the n-type projection region within the well to cause the noise charge to be absorbed into the substrate, by isolating the peripheral circuit region containing the noise charge generating source from the memory array region by means of the isolation region 44, by eliminating interference between the memory cells caused by the noise charge by means of the isolation region 43, and by providing within the P-type well of each cell the P+-type buried region acting as the barrier against the noise charge.

Though FIGS. 18 and 19 illustrate exemplarily the devices including all of the foregoing regions (i)–(iv), it is needless to say that each region provides its respective effect individually even if it is incorporated independently.

Now, the CMOS device to be put in operation at low temperature as is the case of the foregoing MOS transistor will be described.

Figure 20:
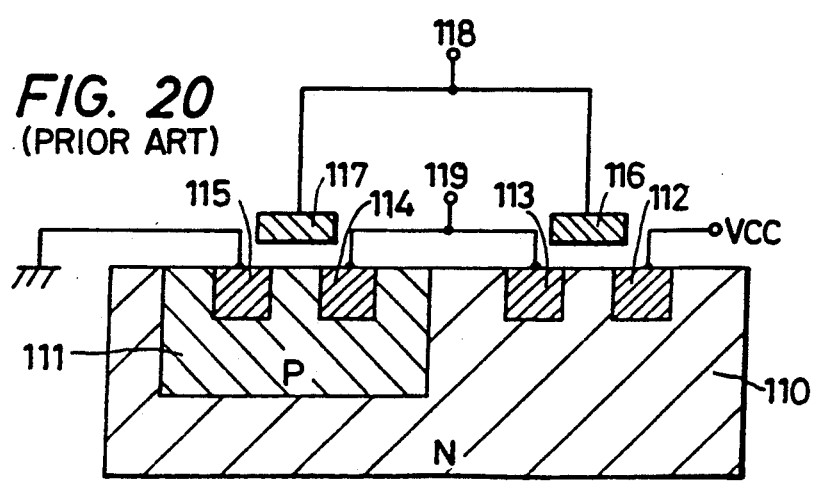
FIG. 20 is a structural diagram of the conventional CMOS device.
Figure 21:
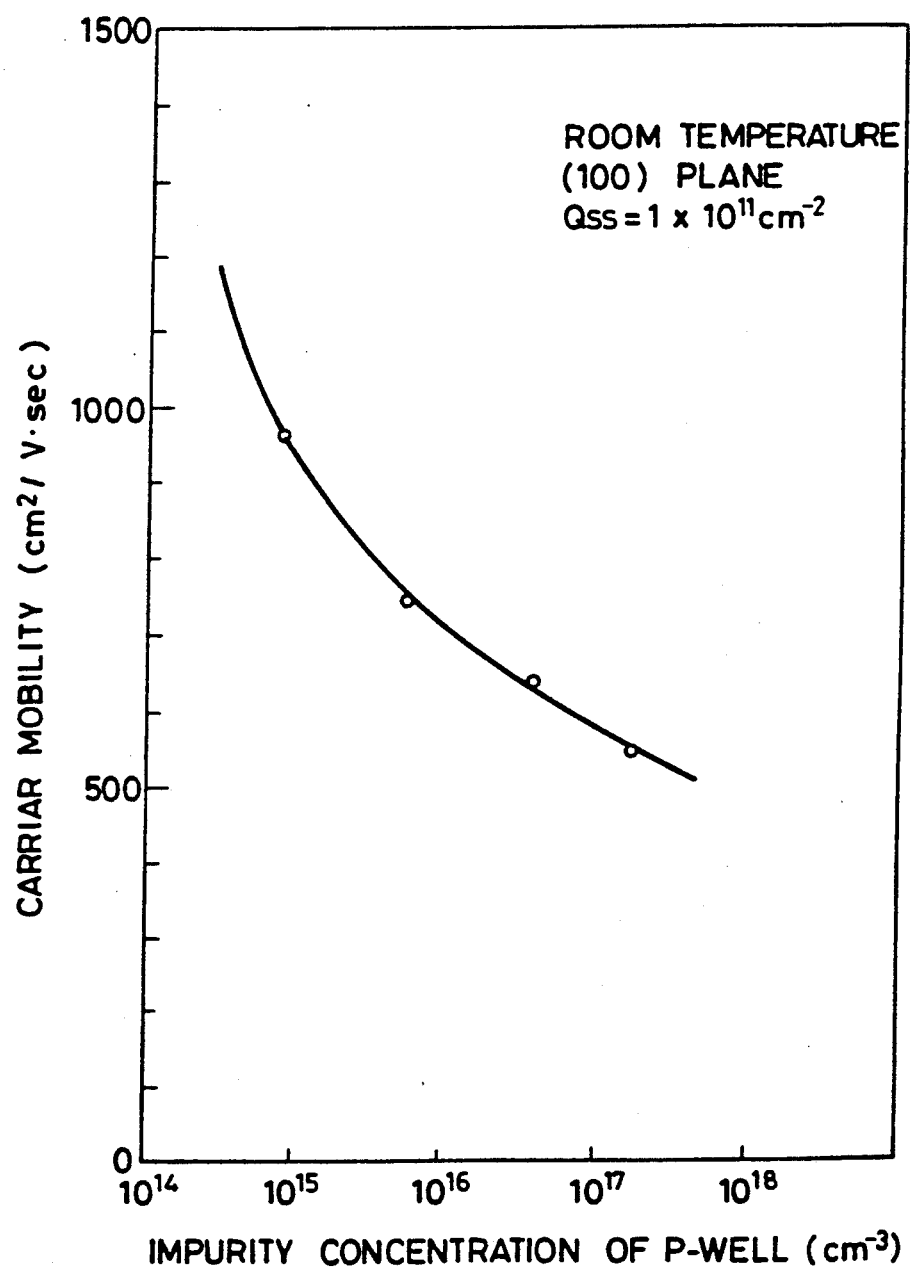
FIG. 21 is a graph showing the dependence of the carrier mobility of n-MOS on the impurity concentration of p-well.

FIG. 20 illustrates the sectional structure of the conventional CMOS device disclosed in Japanese Patent Publication No. 43-18218. In FIG. 20, 110 is a n-type Si substrate in which a p-channel MOS FET is formed having a source 112 and a drain 113 of p-type high impurity concentration and a gate 116. An n-channel MOS FET is formed in a surface region of a p-well 111, having a drain 114 and a source 115 of n-type high impurity concentration and a gate 117. A typical CMOS inverter can be formed by connecting together 116 and 117 to give an input terminal 118 and connecting together 113 and 114 to give an output terminal 119. Speedup of such CMOS devices is limited by the value of carrier mobility of both n- and p-type transistors. FIG. 21 illustrates the measured value of carrier mobility in the n-channel MOS FET of the conventional structure as the function of impurity concentration of p-well. The value of impurity concentration used widely in the prior art is $10^{15} - 10^{17}$ cm$^{-3}$ and the corresponding value of carrier mobility is 550–900 cm$^2$/V·sec (room temperature value). The reason that the carrier mobility increases as the impurity concentration decreases is because impurity scattering becomes weak. At low temperature, since the ratio of impurity scattering to phonon scattering becomes large, the increment of mobility becomes remarkably large if the impurity concentration is lowered.

Accordingly, if the impurity concentration of the p-well (the impurity concentration of the n-substrate in case of the p-MOS) is lowered, the carrier mobility can be increased, but, the thickness of a surface space charge layer also increases. Thus, there was the problem that punch-through occurs easily.

In view of the above, the present invention features, in order to increase the carrier mobility, a semiconductor layer of very small impurity concentration formed in a Si surface layer in which a channel is to be formed. According to this structure, an increase of the mobility can be realized especially when the device is put in operation at low temperature because the impurity concentration of the Si surface layer where the carrier moves is small, and, if the thickness of the foregoing impurity concentration layer is made about 100 n m, speedup of the device can be realized without increasing appreciably the width of the surface space charge layer.

Figure 22:
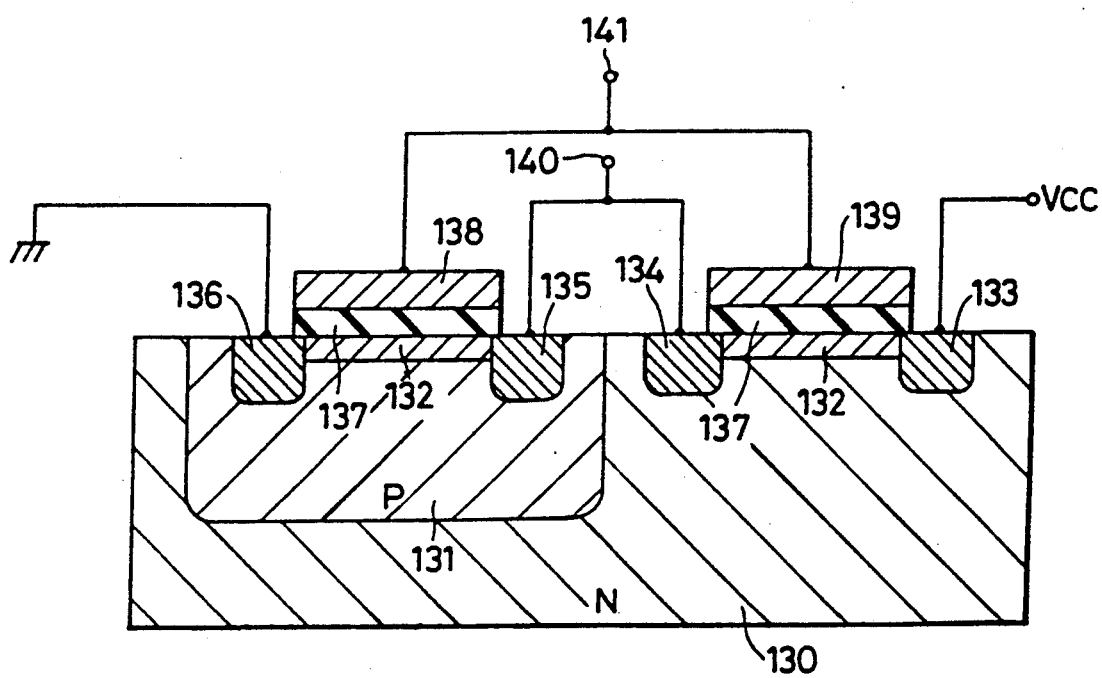
FIG. 22 is a diagram showing an embodiment of the CMOS device structure of the present invention.

Now, an embodiment for the above aspect of the present invention will be described with reference to FIG. 22. In FIG. 22, 130 is an n-type Si substrate, 131 is a p-type well, and 132 is a low impurity concentration semiconductor layer formed in the surface region of the n-type Si substrate 130 and p-type well 131. A p-channel MOS FET is formed in the surface region of the substrate 130, having a source 133 and a drain 134 of p-type impurity concentration regions, an insulation film 137 and a gate 139. An n-channel MOS FET is formed in the surface region of the p-type well 131, having a drain 135 and a source 136 of n-type impurity regions, an insulation film 137 and a gate 138. The CMOS inverter circuit according to the present invention can be formed by connecting 138 and 139 together to give an input terminal 141, connecting 134 and 135 together to give an output terminal 140, and treating 133 as a power source terminal and 136 as a ground terminal. The mobility at low temperature of both n- and p-channel transistors has become remarkably increased because of the low impurity concentration layer 132 formed in the channel section. Thus, a low-temperature-operable device of very high speed in comparison to the conventional device can be realized. For reference, the thickness of the foregoing low impurity concentration layer is made less than 100 n m in order to prevent punch-through of the MOS transistor from occurring. Further, formation of the foregoing low impurity concentration layer is done as below. By the use of known liquid phase epitaxial growth processes a thin and low impurity concentration layer can not be formed because the impurity diffuses from the side of the substrate and well. Accordingly, the foregoing low impurity concentration layer is formed by evaporating amorphous Si in ultra-high-vacuum onto the Si surface and passing it through a low-temperature annealing process of about 600° C. In the above way, the impurity concentration is set to a value within one order of magnitude in comparison with the concentration of the substrate and well.

Though in the above embodiment the CMOS device with the n-substrate has been described, the present invention can of course be applied to the case of using a p-type substrate, forming an n-channel MOS FET in the surface of that substrate and forming a p-MOS in a well surface provided on the same substrate.

While the preferred embodiments have been described, variations thereto will occur to those skilled in the art within the scope of the present inventive concepts which are delineated by the following claims.

What is claimed is:

1. A method of forming a MOS field effect transistor for operation in a range of temperature below 100° K., comprising:
   separately forming a source and a drain region of a second type of conductivity in a semiconductor region of a first type of conductivity;
   forming a low impurity concentration layer on a surface region of said semiconductor region between said source region and said drain region by evaporating amorphous silicon on said surface region and passing it through a low-temperature annealing process, wherein said low impurity concentration layer has a lower total impurity concentration than said semiconductor region, and has a thickness not more than 100 nm;
   forming a gate insulating layer on said low impurity concentration layer; and
   forming a gate electrode on said gate insulating layer.

2. A method according to claim 1, wherein said source and drain regions are p-type regions in an N-type silicon substrate.

3. A method according to claim 1, wherein said semiconductor region comprises a silicon substrate region.

4. A method according to claim 3, wherein said first and second type of conductivity correspond to N and P-type, respectively.

5. A method according to claim 1, wherein said low impurity concentration layer has a total impurity concentration which is substantially one order of magnitude less than the impurity concentration of said semiconductor region.

6. A method of forming a complementary MOS integrated device having a first and a second MOS transistor for operation in a range of temperature below 100° K., comprising:
   forming said first MOS transistor by the steps of:
   separately forming a first source and a first drain region of a second type of conductivity in a first semiconductor region of a first type of conductivity,
   forming a first low impurity concentration layer on a first surface region of said first semiconductor region between said first source region and said first drain region by evaporating amorphous silicon on said first surface region and passing it through a low-temperature annealing process, said first low impurity concentration layer having a lower total impurity concentration than said first semiconductor region, and having a thickness not more than 100 nm,
   forming a first gate insulating layer on said first low impurity concentration layer, and
   forming a first gate electrode on said first gate insulating layer; and forming said second MOS transistor by the steps of:
   forming a second source and a second drain region of said first type of conductivity separately in a second semiconductor region of the second conductivity type,
   forming a second low impurity concentration layer on a second surface region of said second semiconductor region between said second source region and said second drain region by evaporating amorphous silicon on said second surface region and passing it through a low-temperature annealing process, said second low impurity concentration layer having a lower total impurity concentration than that of said second semiconductor region, and having a thickness not more than 100 nm,
   forming a second gate insulating layer on said second impurity concentration layer, and
   forming a second gate electrode on said second gate insulating layer.

7. A method according to claim 6, wherein said first and second MOS transistors comprise P and N-channel MOS transistors, respectively.

8. A method according to claim 6, wherein said first semiconductor region is a silicon type substrate region and wherein said second semiconductor region is formed as a well region in said silicon substrate region.

9. A method according to claim 6, wherein said first low impurity concentration layer has a total impurity concentration which is substantially one order of magnitude less than the impurity concentration of said first semiconductor region, and wherein said second low impurity concentration layer has a total impurity concentration which is substantially one order of magnitude less than the impurity concentration of said second semiconductor region.

10. In a method of forming a MOS field effect transistor for operation in a range of temperature below 100° K., wherein source and drain regions of a second type of conductivity are separately formed in a semiconductor region of a first type of conductivity, a gate insulating layer is formed overlying the semiconductor region between the source and drain regions and a gate electrode is formed on the gate insulating layer, the improvement comprising:

wherein a low impurity concentration layer is formed on a surface region of the semiconductor region between the source region and the drain region, said low impurity concentration layer being formed by evaporating amorphous silicon on the surface region and passing it through a low-temperature annealing process, the low impurity concentration layer having a lower total impurity concentration than that of the semiconductor region and having a thickness not more than 100 nm, the gate insulating layer being provided on the low impurity concentration layer.

11. In a method of forming a complementary MOS integrated device having a first and a second MOS transistor for operation in a range of temperature below 100° K., including (1) forming the first MOS transistor by steps including separately forming a first source and a first drain region of a second conductivity type in a first semiconductor region of a first type of conductivity, forming a first gate insulating layer overlying the first semiconductor region between the first source region and the first drain region and forming a first gate electrode on the first gate insulating layer; and (2) forming the second MOS transistor by steps including separately forming a second source and a second drain region of the first type of conductivity in a second semiconductor region of second conductivity type, forming a second gate insulating film overlying the second semiconductor region between the second source region and the second drain region and forming a second gate electrode on the second gate insulating layer, wherein the improvement comprises:

(a) forming a first low impurity concentration layer on a first surface region of the first semiconductor region between the first source region and the first drain region by evaporating amorphous silicon on the first surface region and passing it through a low-temperature anealing process, the first low impurity concentration layer having a lower total impurity concentration than that of the first semiconductor region and having a thickness not more than 100 nm, with the first gate insulating layer being provided on the first low impurity concentration layer; and (b) forming a second low impurity concentration layer on a second surface region of the second semiconductor region between the second source region and the second drain region by evaporating amorphous silicon on the second surface region and passing it through a low-temperature annealing process, the second low impurity concentration layer having a lower total impurity concentration than that of the second semiconductor region and having a thickness not more than 100 nm, with the second gate insulating layer being formed on the second impurity concentration layer.

* * * * *